(12) United States Patent
Woo et al.

(10) Patent No.: US 9,635,227 B2
(45) Date of Patent: *Apr. 25, 2017

(54) 3D CAMERA ASSEMBLY HAVING A BRACKET FOR CAMERAS AND MOBILE TERMINAL HAVING THE SAME

(71) Applicant: LG Electronics Inc., Seoul (KR)

(72) Inventors: Ramchan Woo, Seoul (KR); Byungjoon Kim, Seoul (KR); Jinho Jang, Seoul (KR); Chiyoung Kim, Seoul (KR); Jaeyeol Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/276,284

(22) Filed: Sep. 26, 2016

(65) Prior Publication Data

US 2017/0013178 A1 Jan. 12, 2017

Related U.S. Application Data

(63) Continuation of application No. 13/310,064, filed on Dec. 2, 2011, now Pat. No. 9,479,758.

(30) Foreign Application Priority Data

Aug. 3, 2011 (KR) ........................ 10-2011-0077181

(51) Int. Cl.
*H04N 13/02* (2006.01)
*H04N 5/225* (2006.01)
(Continued)

(52) U.S. Cl.
CPC ......... *H04N 5/2252* (2013.01); *H04N 5/2257* (2013.01); *H04N 5/23293* (2013.01);
(Continued)

(58) Field of Classification Search
CPC ............. H04N 5/2252; H04N 5/23293; H04N 13/0239; H04N 5/44; H04N 2213/001; H04N 5/2257
See application file for complete search history.

(56) References Cited

U.S. PATENT DOCUMENTS

2008/0298674 A1 12/2008 Baker et al.
2009/0135247 A1* 5/2009 Busse ................ H04N 13/0239
348/46
(Continued)

FOREIGN PATENT DOCUMENTS

EP 2063649 A2 5/2009
JP 11-237684 A 8/1999
(Continued)

*Primary Examiner* — Gims Philippe
*Assistant Examiner* — Jill Sechser
(74) *Attorney, Agent, or Firm* — Birch, Stewart, Kolasch & Birch, LLP

(57) ABSTRACT

A 3D camera and a mobile terminal having the same can include a front body including a touch screen; a rear body coupled to the front body, the rear body including first and second holes; first and second cameras for capturing an image, the first and second cameras corresponding to the first and second holes; a bracket coupled to the first and second cameras, the bracket including third and fourth holes corresponding the first and second cameras; a main printed circuit board (PCB) for operation of the mobile terminal; a camera PCB coupled to the first and second cameras; and a connector extended from the camera PCB and connected to the main PCB electrically. Also, the bracket surrounds each of the first and second cameras, and at least a portion of the bracket is surrounded by the main PCB.

10 Claims, 26 Drawing Sheets

(51) Int. Cl.
*H04N 5/232* (2006.01)
*H04N 5/44* (2011.01)

(52) U.S. Cl.
CPC ........... *H04N 5/44* (2013.01); *H04N 13/0239* (2013.01); *H04N 2213/001* (2013.01)

(56) References Cited

U.S. PATENT DOCUMENTS

| | | | |
|---|---|---|---|
| 2009/0147128 A1* | 6/2009 | Suh | H04N 5/2251 348/374 |
| 2012/0044411 A1* | 2/2012 | Wang | H04N 5/2257 348/374 |
| 2012/0188420 A1 | 7/2012 | Black et al. | |

FOREIGN PATENT DOCUMENTS

| | | |
|---|---|---|
| JP | 2006-91177 A | 4/2006 |
| JP | 2006-270264 A | 10/2006 |

\* cited by examiner

3D CAMERA ASSEMBLY HAVING A BRACKET FOR CAMERAS AND MOBILE TERMINAL HAVING THE SAME

CROSS REFERENCE TO RELATED APPLICATIONS

This application is a Continuation of co-pending U.S. application Ser. No. 13/310,064, filed on Dec. 2, 2011, which claims priority under 35 U.S.C. §119(a), to Korean Patent Application No. 10-2011-0077181, filed on Aug. 3, 2011. The entire contents of each of these applications are hereby incorporated by reference.

BACKGROUND

1. Field of the Invention

The present invention relates to a 3D camera assembly and a mobile terminal having the same, and more particularly, to a 3D camera assembly, capable of enhancing the utilization of an internal space of a mobile terminal by providing a bracket, which serves to prevent a camera for capturing a 3D image from moving, with a coupling recess enabling the coupling of another printed circuit board (PCB), and a mobile terminal having the same.

2. Related Art

As functions of terminals such as personal computers, laptop computers, cellular phones diversify, the terminals become multimedia players having multiple functions for capturing pictures or moving images, playing music, moving image files and games and receiving broadcasting programs.

Terminals can be categorized as mobile terminals and stationary terminals. The mobile terminals can be further comprised of handheld terminals and vehicle mount terminals according to whether users can personally carry the terminals. Conventional terminals including mobile terminals provide an increasing number of complex and various functions.

To support and enhance the increasing number of functions in a terminal, improving a structural part and/or a software part of the terminal would be desirable.

SUMMARY

Accordingly, one object of the present invention is to address the above-noted and other drawbacks of the related art.

Another object of the present invention is to provide a 3D camera assembly and a mobile terminal having the same, and more particularly, to a 3D camera assembly, capable of enhancing the utilization of an internal space of a mobile terminal by providing a bracket, which serves to prevent a camera for capturing a 3D image from moving, with a coupling recess enabling the coupling of another printed circuit board (PCB), and a mobile terminal having the same.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

The present invention will now be described more fully with reference to the accompanying drawings, in which embodiments of the invention are shown. The invention may, however, be embodied in many different forms and should not be construed as being limited to the embodiments set forth herein; rather, there embodiments are provided so that this disclosure will be thorough and complete, and will fully convey the concept of the invention to those skilled in the art.

Hereinafter, a mobile terminal relating to the present invention will be described below in more detail with reference to the accompanying drawings. In the following description, suffixes "module" and "unit" are given to components of the mobile terminal in consideration of only facilitation of description and do not have meanings or functions discriminated from each other.

The mobile terminal described in the specification can include a cellular phone, a smart phone, a laptop computer, a digital broadcasting terminal, personal digital assistants (PDA), a portable multimedia player (PMP), a navigation system and similar devices.

Figure 1:
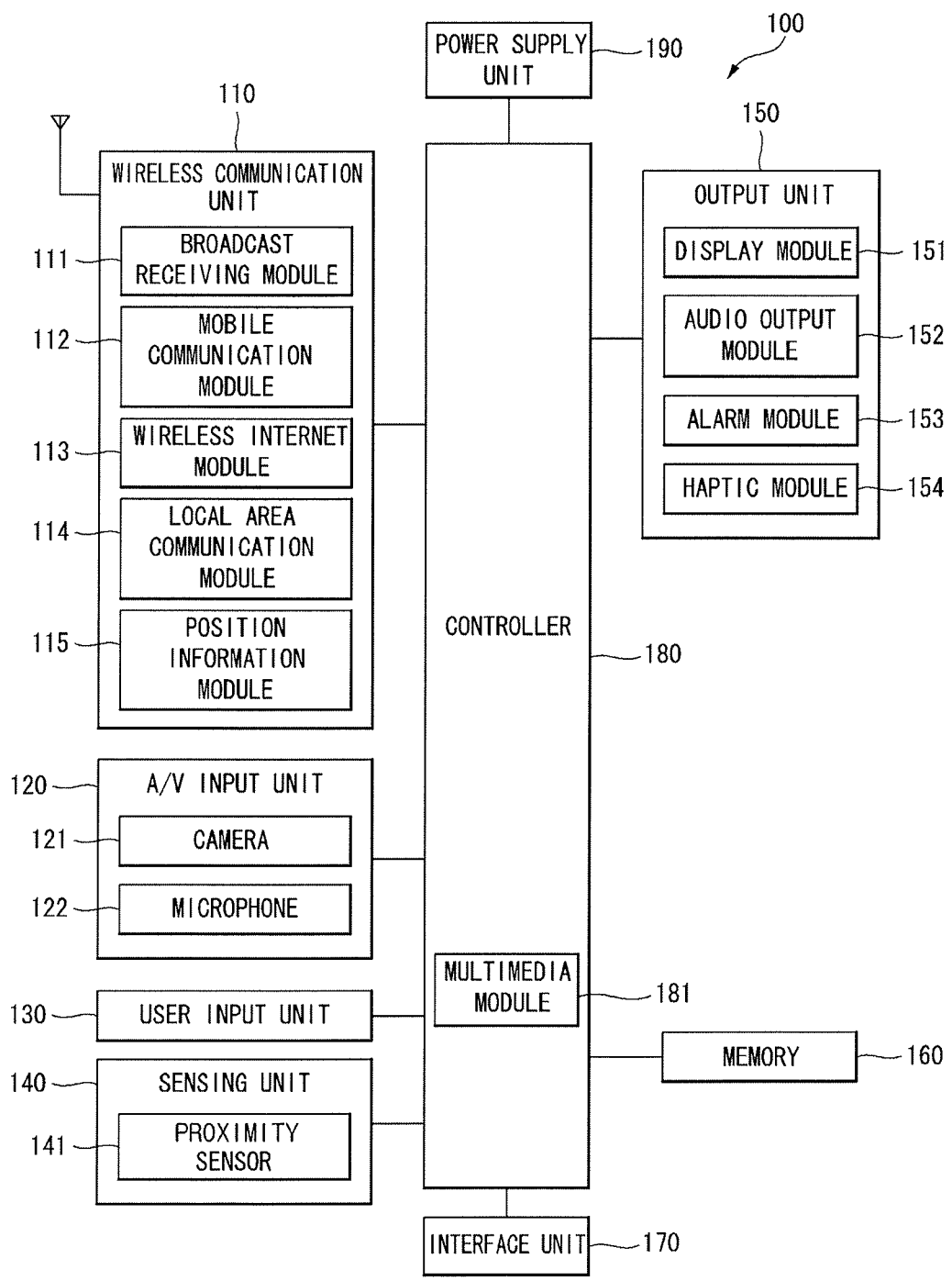
FIG. 1 is a block diagram of a mobile terminal according to an embodiment of the present invention.

FIG. 1 is a block diagram of a mobile terminal 100 according to an embodiment of the present invention. Other embodiments, configurations and arrangements may also be provided. As shown, the mobile terminal 100 may include a radio communication unit 110, an audio/video (A/V) input unit 120, a user input unit 130, a sensing unit 140, an output unit 150, a memory 160, an interface unit 170, a controller 180, and a power supply 190. Not all of the components shown in FIG. 1 may be essential parts and the number of components included in the mobile terminal 100 may be varied. The components of the mobile terminal 100 will now be described.

The radio communication unit 110 may include at least one module that enables radio communication between the mobile terminal 100 and a radio communication system or between the mobile terminal 100 and a network in which the mobile terminal 100 is located. For example, the radio communication unit 110 may include a broadcasting receiving module 111, a mobile communication module 112, a wireless Internet module 113, a local area communication module 114, and a location (or position) information module 115.

The broadcasting receiving module 111 may receive broadcasting signals and/or broadcasting related information from an external broadcasting management server through a broadcasting channel. The broadcasting channel may include a satellite channel and a terrestrial channel, and the broadcasting management server may be a server that generates and transmits broadcasting signals and/or broadcasting related information or a server that receives previously created broadcasting signals and/or broadcasting related information and transmits the broadcasting signals and/or broadcasting related information to a terminal.

The broadcasting signals may include not only TV broadcasting signals, radio broadcasting signals, and data broadcasting signals but also signals in the form of a combination of a TV broadcasting signal and a radio broadcasting signal. The broadcasting related information may be information on a broadcasting channel, a broadcasting program or a broadcasting service provider, and may be provided even through a mobile communication network. In the latter instance, the broadcasting related information may be received by the mobile communication module 112.

The broadcasting related information may exist in various forms. For example, the broadcasting related information may exist in the form of an electronic program guide (EPG) of a digital multimedia broadcasting (DMB) system or in the form of an electronic service guide (ESG) of a digital video broadcast-handheld (DVB-H) system.

The broadcasting receiving module 111 may receive broadcasting signals using various broadcasting systems. More particularly, the broadcasting receiving module 111 may receive digital broadcasting signals using digital broadcasting systems such as a digital multimedia broadcasting-terrestrial (DMB-T) system, a digital multimedia broadcasting-satellite (DMB-S) system, a media forward link only (MediaFLO) system, a DVB-H and integrated services digital broadcast-terrestrial (ISDB-T) systems. The broadcasting receiving module 111 may receive signals from broadcasting systems providing broadcasting signals other than the above-described digital broadcasting systems.

The broadcasting signals and/or broadcasting related information received through the broadcasting receiving module 111 may be stored in the memory 160. The mobile communication module 112 may transmit/receive a radio signal to/from at least one of a base station, an external terminal and a server on a mobile communication network. The radio signal may include a voice call signal, a video telephony call signal or data in various forms according to transmission and reception of text/multimedia messages.

The wireless Internet module 113 may correspond to a module for wireless Internet access and may be included in the mobile terminal 100 or may be externally attached to the mobile terminal 100. Wireless LAN (WLAN or Wi-Fi), wireless broadband (Wibro), world interoperability for microwave access (Wimax), high speed downlink packet access (HSDPA) and so on may be used as a wireless Internet technique.

The local area communication module 114 may correspond to a module for local area communication. Further, Bluetooth®, radio frequency identification (RFID), infrared data association (IrDA), ultra wideband (UWB) and/or Zig-Bee® may be used as a local area communication technique.

The location information module 115 may confirm or obtain the position of the mobile terminal 100. The position information module 115 may obtain position information by using a global navigation satellite system (GNSS). The GNSS is a terminology describing a radio navigation satellite system that revolves around the earth and transmits reference signals to predetermined types of radio navigation receivers such that the radio navigation receivers can determine their positions on the earth's surface or near the earth's surface. The GNSS may include a global positioning system (GPS) of the United States, Galileo of Europe, a global orbiting navigational satellite system (GLONASS) of Russia, COMPASS of China, and a quasi-zenith satellite system (QZSS) of Japan among others.

A global positioning system (GPS) module is a representative example of the location information module 115. The GPS module 115 may calculate information on distances between one point or object and at least three satellites and information on a time when the distance information is measured and apply trigonometry to the obtained distance information to obtain three-dimensional position information on the point or object according to latitude, longitude and altitude at a predetermined time.

A method of calculating position and time information using three satellites and correcting the calculated position and time information using another satellite may also be used. In addition, the GPS module 115 may continuously calculate the current position in real time and calculate velocity information using the location or position information.

As shown in FIG. 1, the A/V input unit 120 may input an audio signal or a video signal and includes a camera 121 and a microphone 122. The camera 121 may process image frames of still images or moving images obtained by an image sensor in a video telephony mode or a photographing mode. The processed image frames may be displayed on a display module 151 which may be a touch screen.

The image frames processed by the camera 121 may be stored in the memory 160 or may be transmitted to an external device through the radio communication unit 110. The mobile terminal 100 may also include at least two cameras 121.

The microphone 122 may receive an external audio signal in a call mode, a recording mode or a speech recognition mode and process the received audio signal into electric audio data. The audio data may then be converted into a form that can be transmitted to a mobile communication base station through the mobile communication module 112 and output in the call mode. The microphone 122 may employ various noise removal algorithms (or noise canceling algorithms) for removing or reducing noise generated when the external audio signal is received.

The user input unit 130 may receive input data for controlling operation of the mobile terminal 100 from a user. The user input unit 130 may include a keypad, a dome switch, a touch pad (constant voltage/capacitance), a jog wheel, a jog switch and similar devices.

The sensing unit 140 may sense a current state of the mobile terminal 100, such as an open/close state of the mobile terminal 100, a position of the mobile terminal 100, whether a user touches the mobile terminal 100, a direction of the mobile terminal 100, and acceleration/deceleration of the mobile terminal 100, and generate a sensing signal for controlling operation of the mobile terminal 100. For example, with a slide phone, the sensing unit 140 may sense whether the slide phone is opened or closed. Further, the sensing unit 140 may sense whether the power supply 190 supplies power and/or whether the interface 170 is connected to an external device. The sensing unit 140 may also include a proximity sensor 141.

The output unit 150 may generate visual, auditory and/or tactile output and may include the display module 151, an audio output module 152, an alarm 153 and a haptic module 154. The display module 151 may display information processed by the mobile terminal 100. The display module 151 may display a user interface (UI) or a graphic user interface (GUI) related to a telephone call when the mobile terminal 100 is in the call mode. The display module 151 may also display a captured and/or received image, a UI or a GUI when the mobile terminal 100 is in a video telephony mode or the photographing mode.

In addition, the display module 151 may include at least one of a liquid crystal display, a thin film transistor liquid crystal display, an organic light-emitting diode display, a flexible display and a three-dimensional display. Some of these displays may be of a transparent type or a light transmissive type. That is, the display module 151 may include a transparent display.

The transparent display may include a transparent liquid crystal display. The rear structure of the display module 151 may also be of a light transmissive type. Accordingly, a user may see an object located behind the body of the mobile terminal 100 through the transparent area of the body of the mobile terminal 100 that is occupied by the display module 151.

The mobile terminal 100 may also include at least two displays 151. For example, the mobile terminal 100 may include a plurality of displays 151 that are arranged on a single face at a predetermined distance or integrated displays. The plurality of displays 151 may also be arranged on different sides of the mobile terminal.

Further, when the display module 151 and a sensor sensing touch (hereafter referred to as a touch sensor) form a layered structure that is referred to as a touch screen, the display module 151 may be used as an input device in addition to an output device. The touch sensor may be in the form of a touch film, a touch sheet, and a touch pad, for example.

The touch sensor may convert a variation in pressure applied to a specific portion of the display module 151 or a variation in capacitance generated at a specific portion of the display module 151 into an electric input signal. The touch sensor may sense pressure of touch as well as position and area of the touch.

When the user applies a touch input to the touch sensor, a signal corresponding to the touch input may be transmitted to a touch controller. The touch controller may then process the signal and transmit data corresponding to the processed signal to the controller 180. Accordingly, the controller 180 may detect a touched portion of the display module 151.

The proximity sensor 141 of the sensing unit 140 may be located in an internal region of the mobile terminal 100, surrounded by the touch screen, or near the touch screen. The proximity sensor 141 may sense an object approaching a predetermined sensing face or an object located near the proximity sensor using an electromagnetic force or infrared rays without having mechanical contact. The proximity sensor 141 may have a lifetime longer than a contact sensor and may thus have a wide application in the mobile terminal 100.

The proximity sensor 141 may include a transmission type photo-electric sensor, a direct reflection type photo-electric sensor, a mirror reflection type photo-electric sensor, a high-frequency oscillating proximity sensor, a capacitive proximity sensor, a magnetic proximity sensor, and/or an infrared proximity sensor. A capacitive touch screen may be constructed such that proximity of a pointer is detected through a variation in an electric field according to the proximity of the pointer. The touch screen (touch sensor) may be classified as a proximity sensor 141.

For ease of convenience of explanation, an action of the pointer approaching the touch screen without actually touching the touch screen may be referred to as a proximity touch and an action of bringing the pointer into contact with the touch screen may be referred to as a contact touch. The proximity touch point of the pointer on the touch screen may correspond to a point of the touch screen at which the pointer is perpendicular to the touch screen.

The proximity sensor 141 may sense the proximity touch and a proximity touch pattern (e.g., a proximity touch distance, a proximity touch direction, a proximity touch velocity, a proximity touch time, a proximity touch position, a proximity touch moving state, etc.). Information corresponding to the sensed proximity touch action and proximity touch pattern may then be displayed on the touch screen.

The audio output module 152 may output audio data received from the radio communication unit 110 or stored in the memory 160 in a call signal receiving mode, a telephone call mode or a recording mode, a speech recognition mode and a broadcasting receiving mode. The audio output module 152 may output audio signals related to functions, such as a call signal incoming tone and a message incoming tone, performed in the mobile terminal 100. The audio output module 152 may include a receiver, a speaker, a buzzer, and the like. The audio output module 152 may output sounds through an earphone jack. The user may hear the sounds by connecting an earphone to the earphone jack.

The alarm 153 may output a signal for indicating generation of an event of the mobile terminal 100. For example, alarms may be generated when receiving a call signal, receiving a message, inputting a key signal, or inputting touch. The alarm 153 may also output signals in forms different from video signals or audio signals, for example, a signal for indicating generation of an event through vibration. The video signals or the audio signals may also be output through the display module 151 or the audio output module 152.

The haptic module 154 may generate various haptic effects that the user can feel. One example of the haptic effects is vibration. The intensity and/or pattern of vibration generated by the haptic module 154 may also be controlled. For example, different vibrations may be combined and output or may be sequentially output.

The haptic module 154 may generate a variety of haptic effects including an effect of stimulus according to an arrangement of pins vertically moving against a contact skin surface, an effect of stimulus according to a jet force or sucking force of air through a jet hole or a sucking hole, an effect of stimulus of rubbing the skin, an effect of stimulus according to contact of an electrode, an effect of stimulus using an electrostatic force, and an effect according to a reproduction of cold and warmth using an element capable of absorbing or radiating heat in addition to vibrations.

The haptic module 154 may not only transmit haptic effects through direct contact but may also allow the user to feel haptic effects through a kinesthetic sense of the user's fingers or arms. The mobile terminal 100 may also include a plurality of haptic modules 154.

The memory 160 may store a program for operation of the controller 180 and temporarily store input/output data such as a phone book, messages, still images, and/or moving images. The memory 160 may also store data about vibrations and sounds in various patterns that are output from when a touch input is applied to the touch screen.

The memory 160 may include at least a flash memory, a hard disk type memory, a multimedia card micro type memory, a card type memory, such as SD or XD memory, a random access memory (RAM), a static RAM (SRAM), a read-only memory (ROM), an electrically erasable programmable ROM (EEPROM), a programmable ROM (PROM) magnetic memory, a magnetic disk or an optical disk. The mobile terminal 100 may also operate in relation to a web storage performing the storing function of the memory 160 on the Internet.

The interface 170 may serve as a path to external devices connected to the mobile terminal 100. The interface 170 may receive data from the external devices or power and transmit the data or power to internal components of the mobile terminal 100 or transmit data of the mobile terminal 100 to the external devices. For example, the interface 170 may include a wired/wireless headset port, an external charger port, a wired/wireless data port, a memory card port, a port for connecting a device having a user identification module, an audio I/O port, a video I/O port, and/or an earphone port.

The interface 170 may also interface with a user identification module that is a chip that stores information for authenticating authority to use the mobile terminal 100. For example, the user identification module may be a user identify module (UIM), a subscriber identify module (SIM) and a universal subscriber identify module (USIM). An identification device including the user identification module may also be manufactured in the form of a smart card. Accordingly, the identification device may be connected to the mobile terminal 100 through a port of the interface 170.

The interface 170 may also be a path through which power from an external cradle is provided to the mobile terminal 100 when the mobile terminal 100 is connected to the external cradle or a path through which various command signals input by the user through the cradle are transmitted to the mobile terminal 100. The various command signals or power input from the cradle may be used as signals for confirming whether the mobile terminal 100 is correctly set in the cradle.

The controller 180 may control overall operations of the mobile terminal 100. For example, the controller 180 may perform control and processing for voice communication, data communication and/or video telephony. The controller 180 may also include a multimedia module 181 for playing multimedia. The multimedia module 181 may be included in the controller 180, as shown in FIG. 1, or may be separated from the controller 180.

The controller 180 may perform a pattern recognition process capable of recognizing handwriting input or picture-drawing input applied to the touch screen as characters or images. The power supply 190 may receive external power and internal power and provide power for operations of the components of the mobile terminal 100 under control of the controller 180.

According to hardware implementation, embodiments of the present disclosure may be implemented using at least one of application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, and/or electrical units for executing functions. The embodiments may be implemented by the controller 180.

According to software implementation, embodiments such as procedures or functions may be implemented with a separate software module executing at least one function or operation. Software codes may be implemented according to a software application written in an appropriate software language. The software codes may be stored in the memory 160 and executed by the controller 180.

Figure 2:
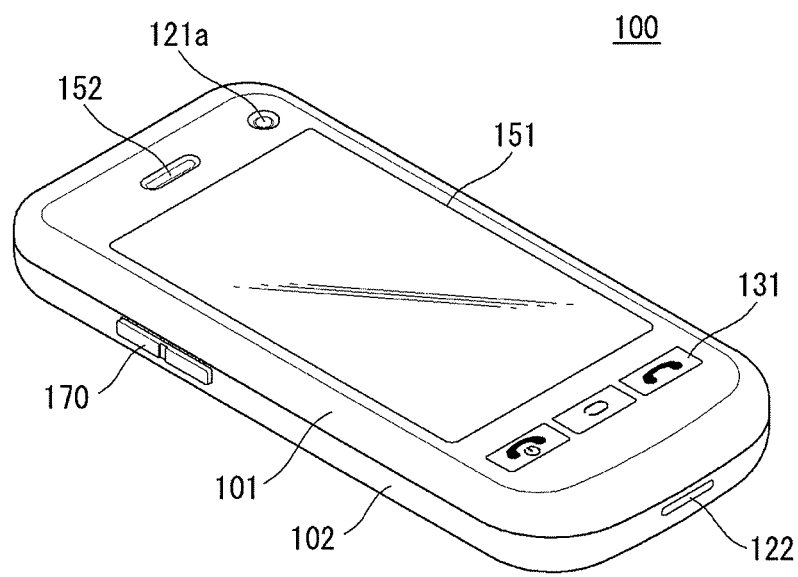
FIG. 2 is a front perspective view of the mobile terminal of FIG. 1.

FIG. 2 is a front perspective view of the mobile terminal of FIG. 1.

As shown in FIG. 2, the mobile terminal 100 according to the embodiment of the present invention may have a bar-shaped body. The bar-shaped body may be formed by injecting a synthetic resin or of a metallic material such as a stainless steel (STS), titanium (Ti), or the like.

However, the present invention is not limited to the description and is applicable to various structures such as a slide type, a folder type, a swing type, a swivel type, or the like in which two or more bodies are coupled to move relative to each other.

The mobile terminal 100 may have a front body 101 and a battery cover 102 exposed to the outside when the assembly thereof is completed.

The front body 101 may be the front side of the mobile terminal 100. On the front body 101, the display module 151, the audio output module 152, a front camera 121a, a user input unit 131, the microphone 122, the interface 170, and the like may be disposed.

The display module 151 may be located on the front side of the front body 101. The display module 151 may display a variety of information desired for the operational process of the mobile terminal 100. The display module 151 may express a 2D image and/or a 3D image.

The audio output module 152 may be a speaker outputting a received sound or the like. There may be a plurality of audio output modules 152. For example, the plurality of audio output modules 152 may be provided to output a received sound or a bell sound.

The front camera 121a may be positioned so as to capture the side of a user. For example, a user may have a video call with another user using his image being captured through the front camera 121a.

The user input unit 131 is manipulated so as to receive a command for controlling the operation of the mobile terminal 100, and may include a plurality of manipulating parts. The user put unit 131 is sensed in an electrostatic manner and may generate light when receiving a user's input.

The user input unit 131 may also be called a manipulating part, and may be operated in a tactile manner while a user applies a tactile sense thereto. This means the user input unit 131 may be a physical button, for example.

Functions that are frequently or mainly used may be allocated to the user input unit 131. For example, functions associated with starting or terminating the mobile terminal 100 and/or an application, controlling the volume, or the like may be allocated to the user input unit 131.

The microphone 122 may be a device for acquiring a user's voice or the like. The microphone 122 may be positioned at the lower side of the mobile terminal 100.

The interface 170 may include a USB port or the like for connection with an external device.

Figure 3:
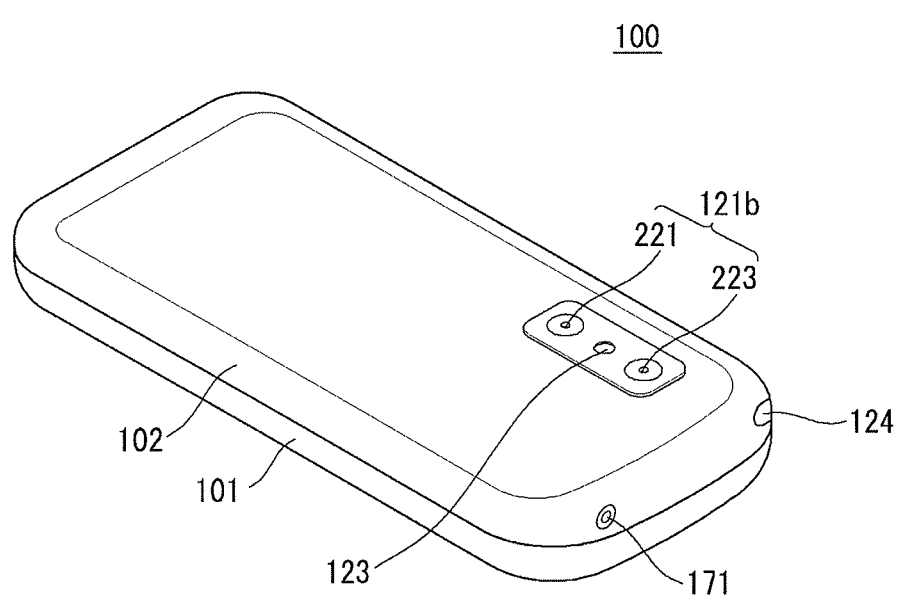
FIG. 3 is a rear perspective view of the mobile terminal of FIG. 2.

FIG. 3 is a rear perspective view of the mobile terminal of FIG. 2.

As shown in the drawings, the mobile terminal 100 according to an embodiment of the present invention may have the battery cover 102 exposed at the rear thereof. An earphone jack 171, an antenna 124, and a 3D camera 121b may be positioned at the rear where the battery cover 102 is exposed.

The earphone jack 171 may be an interface allowing the mobile terminal 100 to output sound through an earphone. The earphone jack 171 may include a port transmitting an audio signal, as well as a port for receiving a manipulating signal enabling the manipulation of functions of the mobile terminal 100 through buttons provided on the earphone.

The antenna 124 may be used to acquire a broadcasting signal to provide a digital multimedia broadcasting (DMB) service or the like. For example, the user may draw out the antenna 124 from the body for the clear reception of broadcasting signals.

The 3D camera 121b may be located at the rear side of the mobile terminal 100. The 3D camera 121b, which will be described later, may capture a stereoscopic image.

The 3D camera 121b may capture an image with a plurality of cameras. For example, the 3D camera 12b may include a first camera 221 and a second camera 223. An image captured through the first and second cameras 221 and 223 may include an image for the left eye and an image for the right eye. The left-eye image and the right-eye image are output through a display, capable of expressing a 3D image, such that a user can perceive a 3D effect.

A camera flash 123 may be positioned in proximity to the 3D camera 121b. A camera flash 123 may operate when an image is captured.

Figure 4:
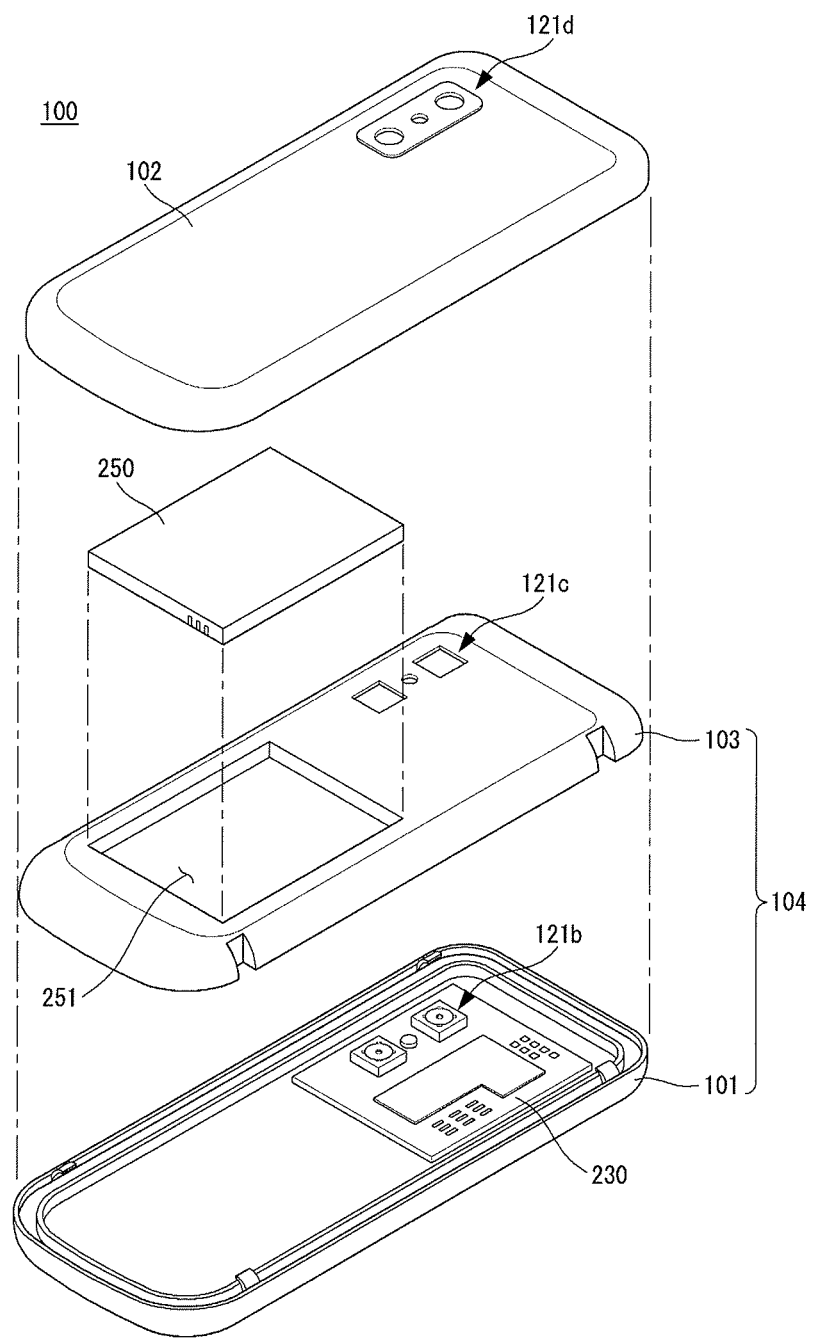
FIG. 4 is an exploded perspective view of the mobile terminal of FIG. 3.

FIG. 4 is an exploded view of the mobile terminal of FIG. 3.

As shown in the drawing, the mobile terminal 100 according to an embodiment of the present invention may include a body 104 including a rear body 103 and a front body 101, and a battery cover 102 coupled to the side of the rear body 103.

The battery cover 102 may cover a battery 250 which is exchangeably coupled to thus improve the exterior appearance. The battery cover 102 may be configured into a pull type which is released from a coupled state as it is pulled in the rear direction of the mobile terminal 100. Also, the battery cover 102 may be configured into a sliding type which is released from a coupled state as it is slid in the length direction of the mobile terminal 100, or a pop-up type which is released from a coupled state as a button is pressed.

The body 104 may be formed by coupling between the rear body 103 and the front body 101.

The rear body 103 may have a battery coupling hole 251 for coupling with the battery 250, and a first camera coupling hole 121c corresponding to the location of the 3D camera 121b.

The front body 101 may have a shape corresponding to the rear body 103. A main PCB 230 may be positioned in the front body 101.

The main PCB 230 may include electronic components and electronic circuits for the operation of the mobile terminal 100. Although not shown in detail, the mobile terminal 100 may include a plurality of PCBs. The 3D camera 121b may be coupled from the lower end of the main PCB 230 toward the upper end thereof. The first camera coupling hole 121c located in the rear body 103 and a second camera coupling hole 121d located in the battery cover 102 may be provided at a location corresponding to the 3D camera 121b positioned on the main PCB 203.

Figure 5:
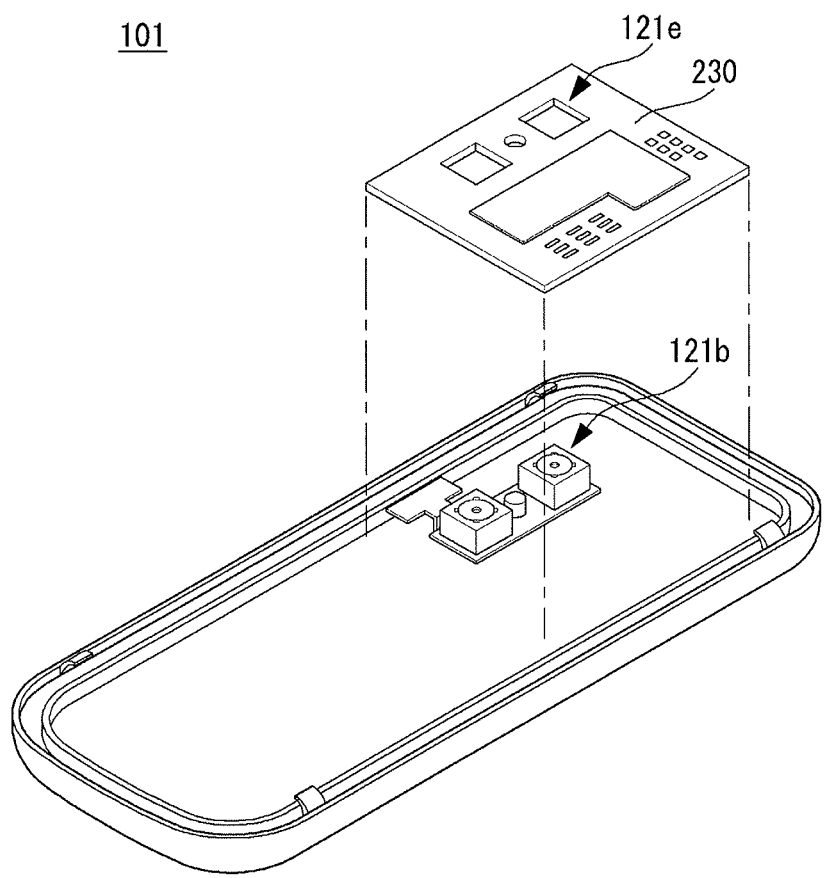
FIG. 5 is an exploded view of a front side of the mobile terminal of FIG. 4.

FIG. 5 is an exploded perspective view of the front side of the mobile terminal of FIG. 4.

As shown in the drawing, the 3D camera 121b of the mobile terminal 100 may be coupled to the main PCB 230. The main PCB 230 may be provided with a third camera coupling hole 121e. That is, the 3D camera 121b may be inserted in the third camera coupling hole 121e.

Figure 6:
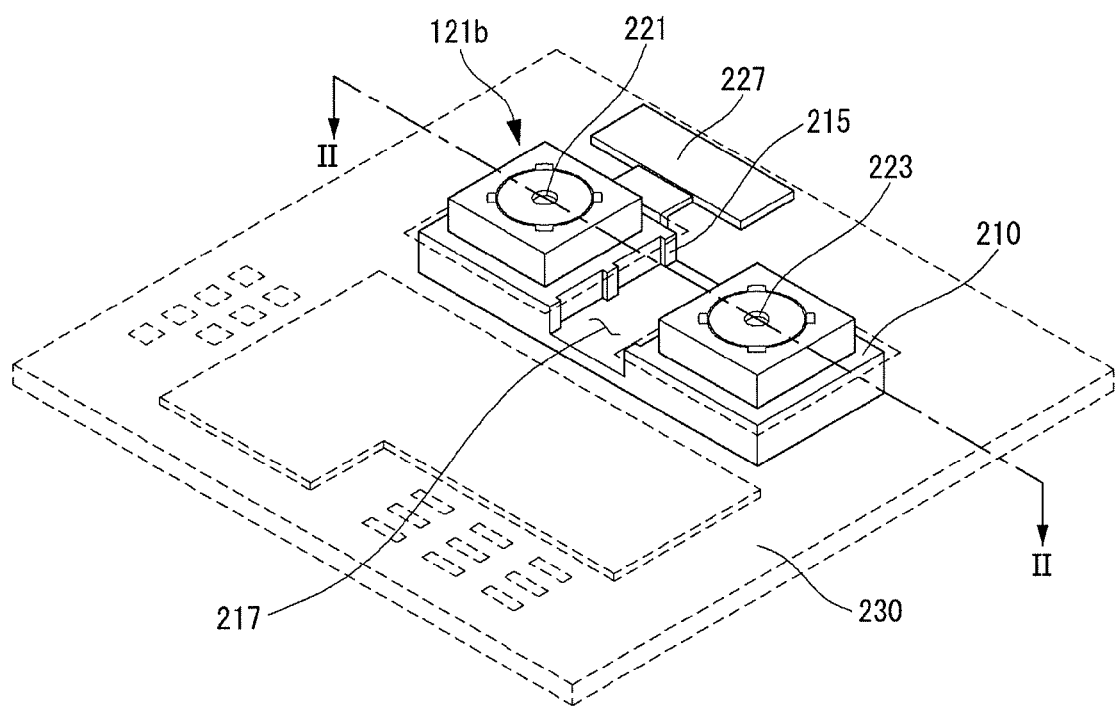
FIG. 6 is a view illustrating the mount of a camera of FIG. 3.

FIG. 6 is a view illustrating the mounting of the camera of FIG. 3.

As shown in the drawing, the 3D camera 121b according to an embodiment of the present invention may be coupled to the main PCB 230.

The 3D camera 121b may include first and second cameras 221 and 223, a bracket 210 fixing the first and second cameras 221 and 223 in position, and a connector 227 extending from a camera PCB (see 225 of FIG. 7) coupled to the first and second cameras 221 and 223.

As described above, the first and second cameras 221 and 223 may be devices for capturing a 3D image.

Figure 7:
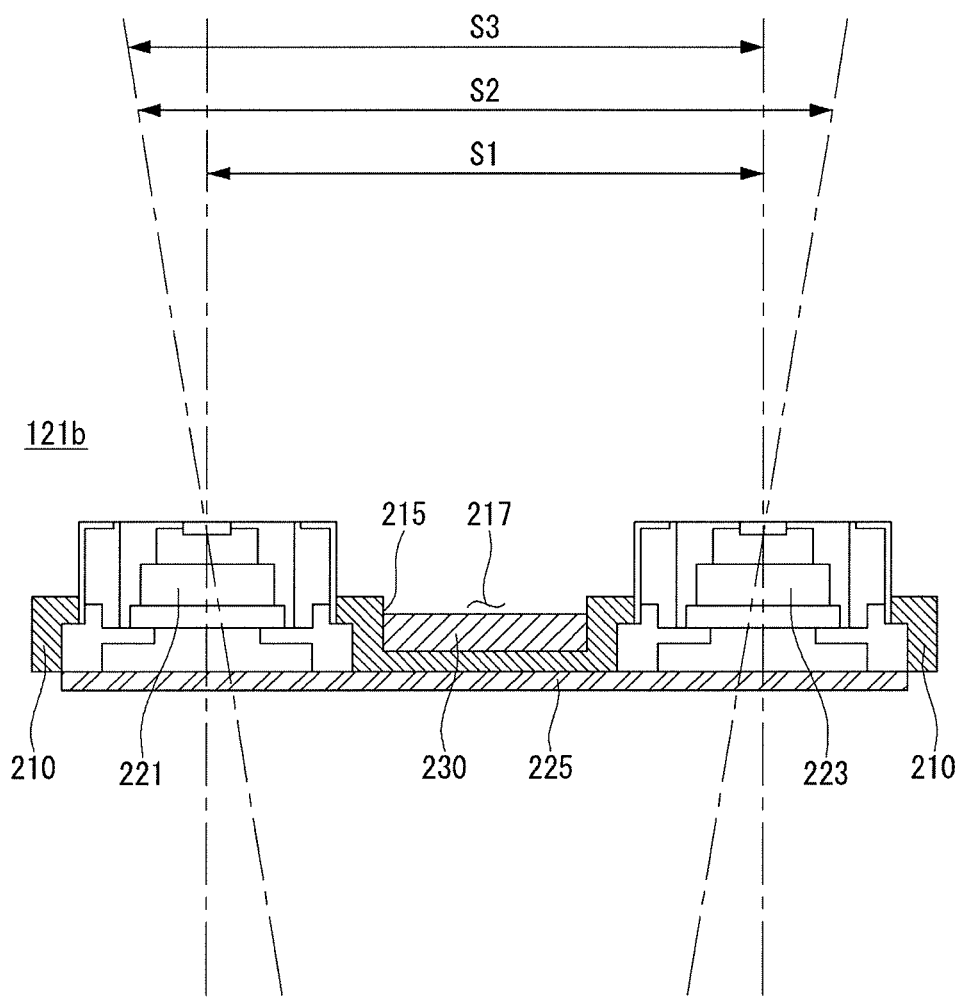
FIG. 7 is a cross-sectional view of the camera taken along line I-I of FIG. 6.

The bracket 210 is coupled to the camera PCB 225 of FIG. 7, and may fix the first and second cameras 221 and 223 in position. In order to capture an accurate 3D image, the first and second cameras 221 and 223 need to capture images at a designed location in a designed direction. Accordingly, location changes of the first and second brackets 221 and 223 need to be minimized while the mobile terminal 100 is in use.

The bracket 210 may be made of a stainless steel (SUS, steel use stainless). That is, the bracket 210 may be formed of a material which is highly resistant to external force. The bracket 210 may have a PCB penetration part 217 and a PCB rib 215 at the central portion thereof.

The PCB penetration part 217 may be a region between the first and second cameras 221 and 223. The presence of the PCB penetration part 217 may allow the main PCB 230 to also be located between the first and second cameras 221 and 223. Accordingly, spatial utilization can be enhanced. For example, if the PCB penetration part 217 is absent at the central portion of the bracket 210, the main PCB 230 cannot be located at the corresponding portion. However, according to an embodiment of the present invention, the presence of the PCB penetration part 217 may maximize the utilization of the internal space of the mobile terminal 100.

FIG. 7 is a cross-sectional view of the camera of FIG. 6.

As shown therein, the 3D camera 121b according to an embodiment of the present invention may maximize the utilization of the internal space while stably maintaining the capturing angles of the first and second cameras 221 and 223.

The first and second cameras 221 and 223 may be coupled to the camera PCB 225. The camera PCB 225 may be formed of a flexible PCB material. Accordingly, the rigidity of the camera PCB 225 itself may be insufficient to stably maintain the capturing directions of the first and second cameras 221 and 223. For example, a first position S1 may be considered to be the position in which the first and second cameras 221 and 223 are stably fixed. In this respect, if the first and second cameras 221 and 223 are changed in position, the capturing direction may be twisted to the second or third position S2 or S3. When the capturing direction is twisted to the second or third position S2 or S3, a normal 3D image may not be captured. It may be impossible to capture a normal 3D image even by the capturing direction twisted by even a few degrees from the first position S1.

The bracket 210 may be coupled to the camera PCB 225 and the first and second cameras 221 and 223. The bracket 210 coupled to the camera PCB 225 and the first and second cameras 221 and 223 may provide a certain level of rigidity so as to prevent the first and second cameras 221 and 223 from being changed in position. That is, the bracket 210 may reinforce rigidity such that the first and second cameras 221 and 223 are fixed in position.

The main PCB 230 may be positioned on the PCB penetration part 217. Because the main PCB 230 is located on the PCB penetration part 217 between the first and second cameras 221 and 223, the utilization of the internal space of the mobile terminal 100 can be enhanced. That is, the use of the bracket 210 may contribute to fixing the first and second cameras 221 and 223 in position while effectively using the internal space of the mobile terminal 100.

The PCB rib 215 may be positioned on the wall surface of the PCB penetration part 217. The presence of the PCB rib 215 allows the main PCB 230 to be stably located on the PCB penetration part 217.

Figure 8:
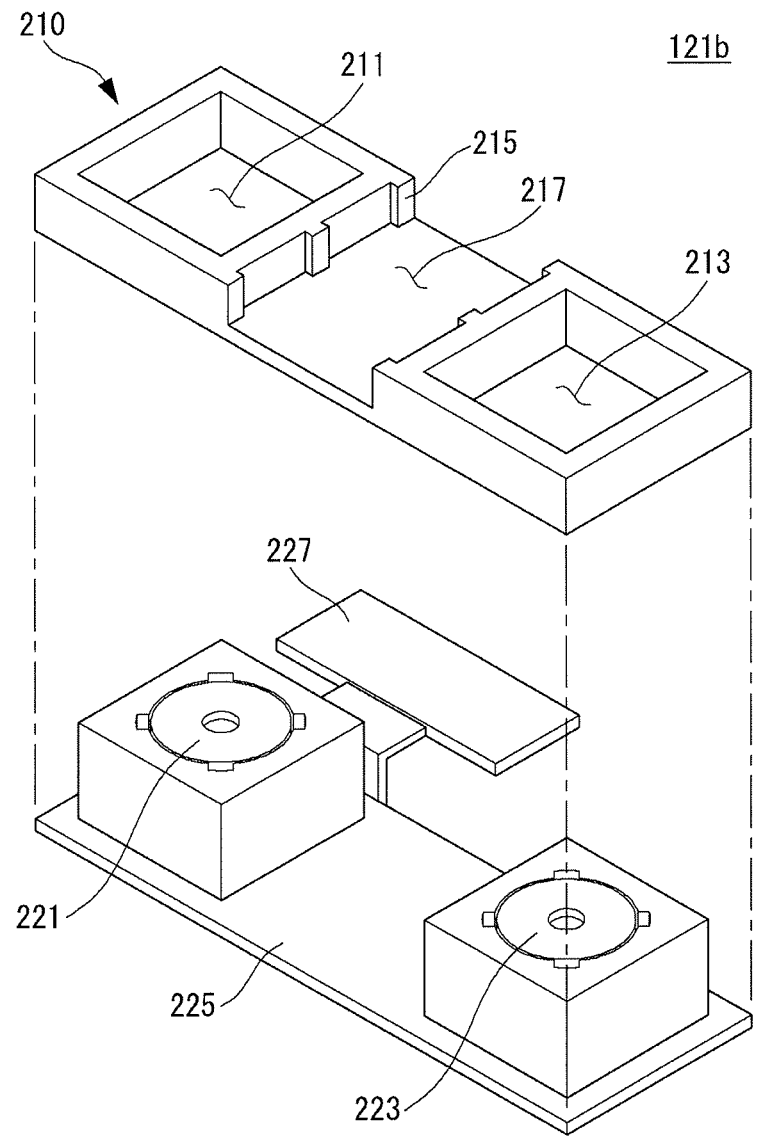
FIG. 8 is an exploded view of the camera of FIG. 6.

FIG. 8 is an exploded view of the camera of FIG. 6.

As shown in the drawing, the bracket 210 may be coupled to the 3D camera 121b of the mobile terminal 100 according to an embodiment of the present invention.

The main PCB 230 may be in the state where the first and second cameras 221 and 223 are coupled thereto.

In the state where the first and second cameras 221 and 223 are coupled to the main PCB 230, the bracket 210 may be coupled to the first and second cameras 221 and 223 and the main PCB 230. When the bracket 210 is coupled, the upper portions of the first and second cameras 221 and 223 are coupled to the first and second coupling holes 211 and 213 of the bracket 210, respectively.

The connector 227 may be located towards to the right or left from the central portion of the camera PCB 225. Such locating of the connector 227 can minimize interference with the main PCB 230 of FIG. 7. That is, in order to prevent the connector 227 from interfering with the main PCB 230 of FIG. 7 when the main PCB 230 of FIG. 7 is coupled to the 3D camera 121b, the connector 227 may be located to avoid the central portion of the camera PCB 225.

Figure 9:
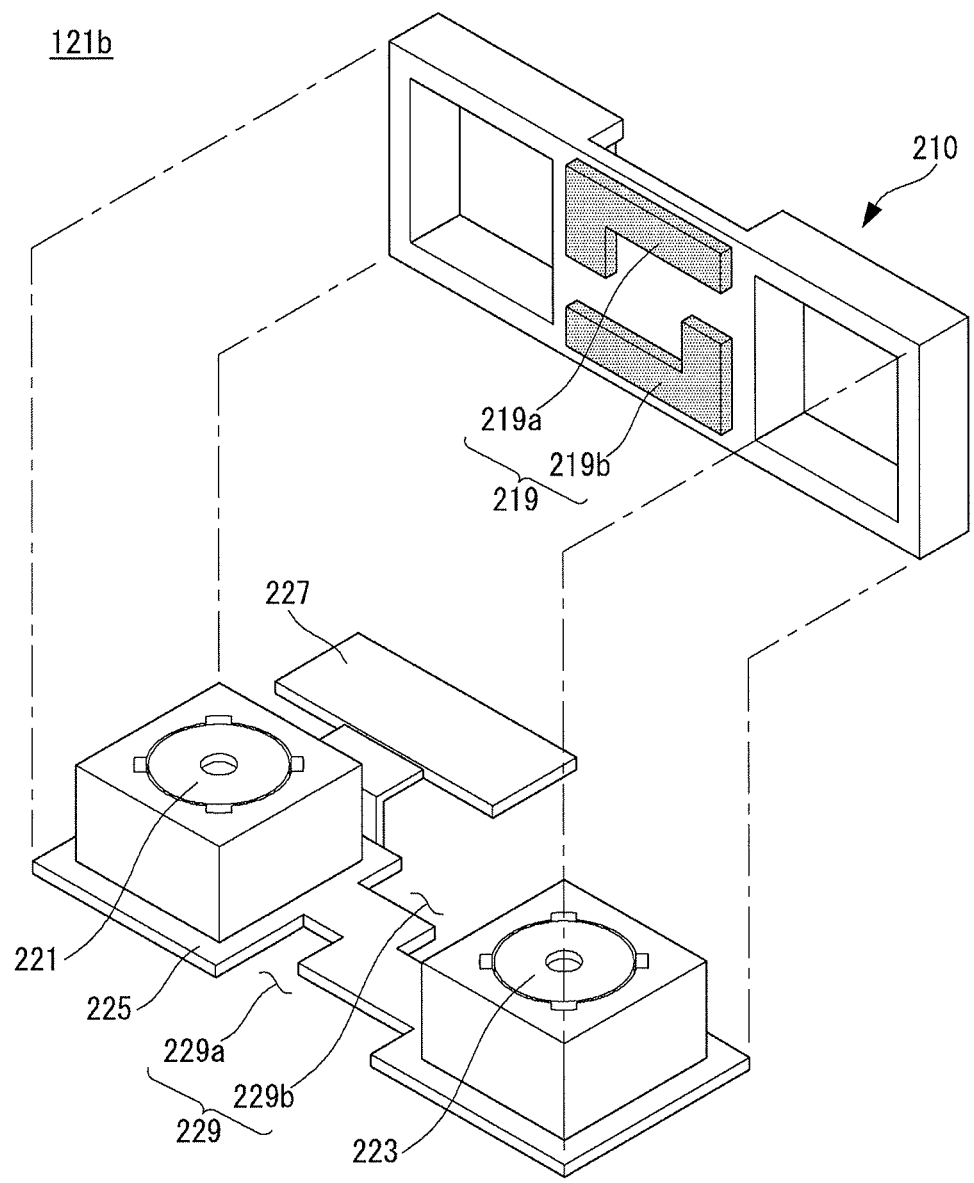
FIG. 9 is an exploded view of a camera according to another embodiment of the present invention.

FIG. 9 is an exploded view of a camera according to another embodiment of the present invention.

The 3D camera 121b according to another embodiment of the present invention may include a reinforcement part 219 provided on the bracket 210, and a coupling part 229 shaped to correspond to the reinforcement part 219.

The reinforcement part 219 may be formed as a lower end portion of the bracket 210 protruding into a predetermined shape. The reinforcement part 219 may include first and second reinforcement portions 219a and 219b.

The first and second reinforcement portions 219a and 219b may be shaped symmetrically to each other. For example, the first and second reinforcement portions 219a and 219b may be shaped like the capital letters Ls opposing each other. Because the bracket 210 is provided with the first and second reinforcement portions 219a and 219b, the bracket 210 can be more resistant to external force. The first and second reinforcement portions 219a and 219b may be formed of the same material as the bracket 210.

The coupling part 229 may be provided in the camera PCB 225. The location and shape of the coupling part 229 may correspond to the first and second reinforcement portions 219a and 219b. For example, the coupling part 229 may be a portion removed from the camera PCB 225 in the form of the capital letters Ls opposing each other. The coupling part 229 may include first and second coupling portions 229a and 229b. The first and second coupling portions 229a and 229b may be provided so as to corresponding to the locations and shapes of the first and second reinforcement portions 219a and 219b.

When the first and second reinforcement portions 219a and 291b are coupled to the first and second coupling portions 229a and 229b, the overall rigidity of the 3D camera 212b can be enhanced by the following reasons. For example, assuming that the rigidity of the camera PCB 225 is A and the rigidity of the bracket 210 is B, B may be greater than A. Accordingly, by substituting a portion of the camera PCB 225 with the bracket 210, the overall rigidity of the 3D camera 121b can be increased. Furthermore, the L shapes of the first and second reinforcement portions 219a and 219b can contribute to enhancing resistance to external force such as torsion or the like.

Figure 10:
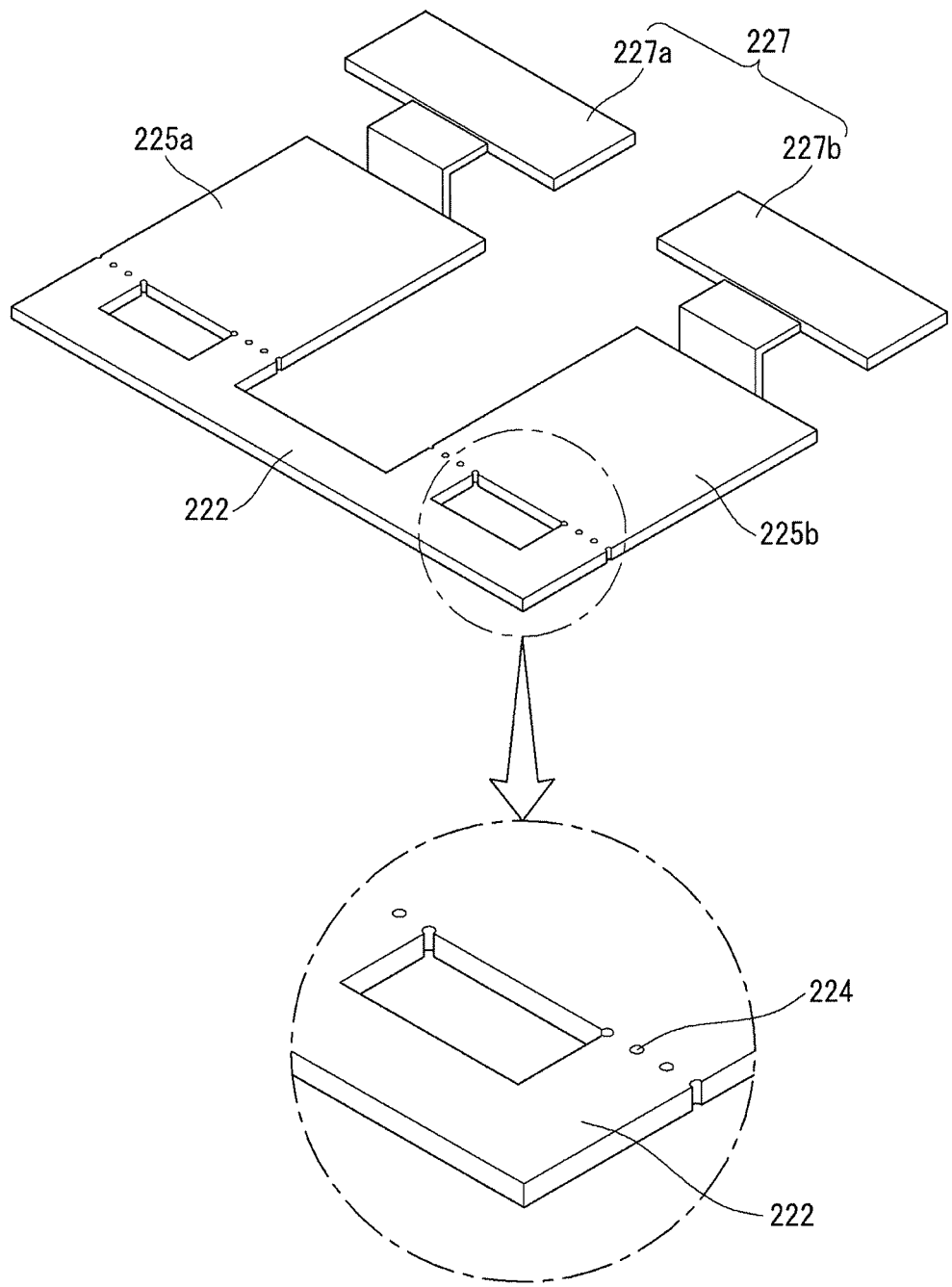
FIGS. 10 through 12 are views illustrating an assembly process of a camera according to another embodiment of the present invention.
Figure 11:
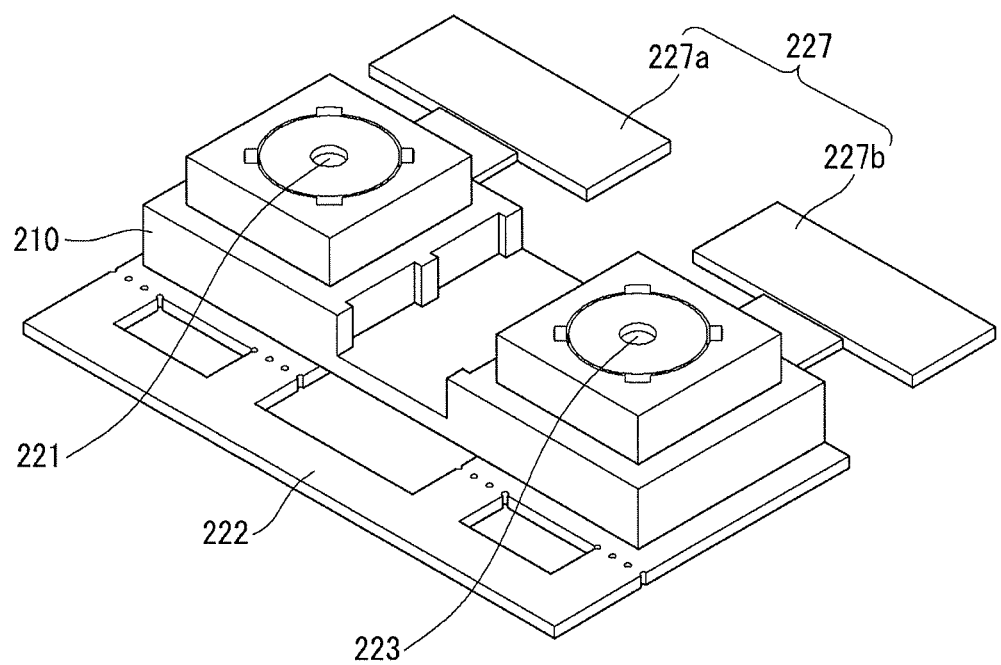
Figure 12:
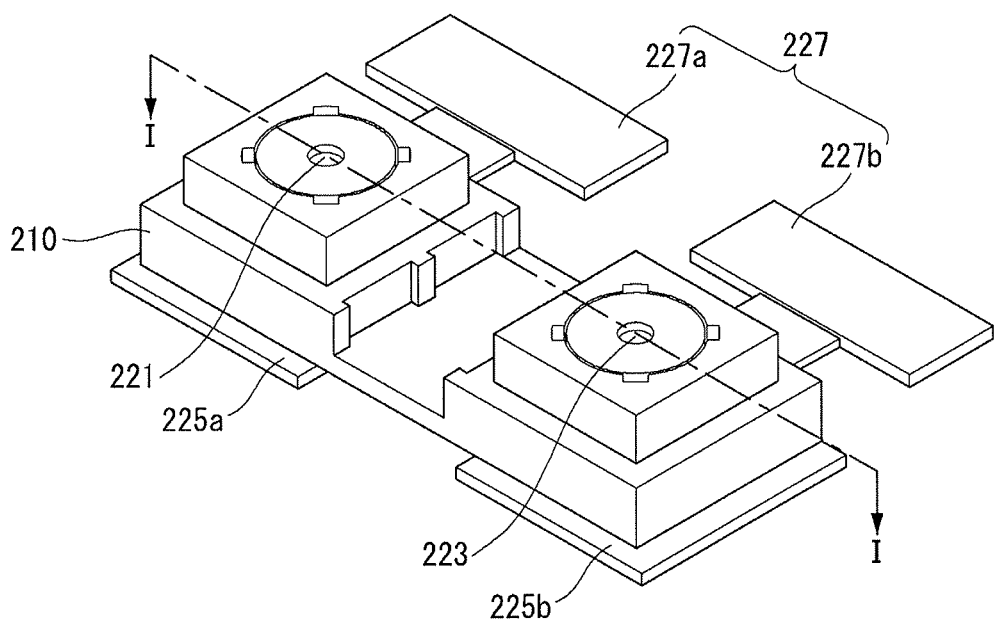

FIGS. 10 through 12 are views illustrating an assembly process of a camera according to another embodiment of the present invention.

As shown in the drawings, the camera PCB 225 of the 3D camera 121b according to another embodiment may have a structure allowing part of the camera PCB 225 to be removed after the assembly process is completed.

As shown in FIG. 10, the camera PCB 225 may be a structure in which a first camera coupling portion 225a and a second camera coupling portion 225b are connected by a connection portion 222.

A cutting portion 224 may be provided between the connection portion 222 and the first and second camera coupling portions 225a and 225b. The cutting portion 224 is located between the connection portion 222 and the first and second camera portions 225a and 225b such that the connection portion 222 can be easily removed. The cutting portion 224 may be a portion provided in the form of a slit in a part of the camera PCB 225 corresponding to the shape of the connection portion 222 to be removed.

The connector 227 may include first and second connectors 227a and 227b corresponding to the first and second camera coupling portions 225a and 225b, respectively.

As shown in FIGS. 11 and 12, the first and second cameras 221 and 223 and the bracket 210 may be coupled to the camera PCB 225.

After the first and second cameras 221 and 223 are coupled to the bracket 210, the connection portion 222 may be removed. Because the first and second camera coupling portions 225a and 225b are integrated into one body until the connection portion 222 is removed, the first and second cameras 221 and 223 may be located in position as designed.

Figure 13:
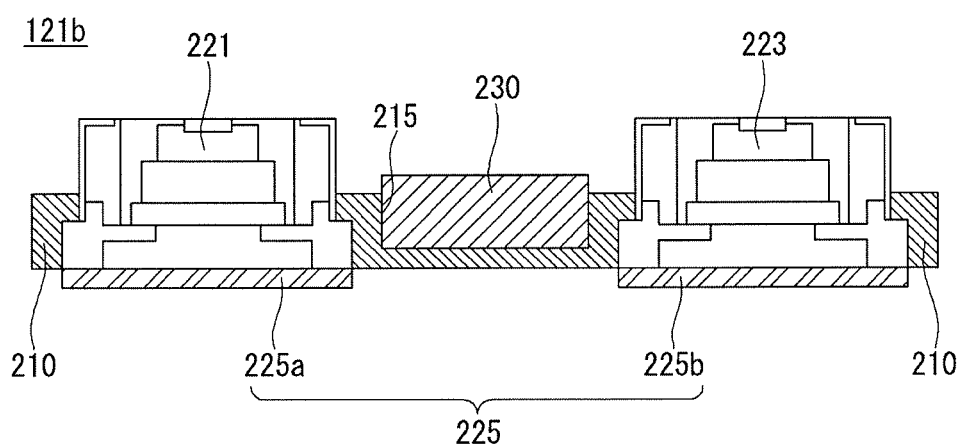
FIG. 13 is a cross-sectional view of the camera taken along line II-II of FIG. 12.

FIG. 13 is a cross-sectional view of the camera illustrated in FIG. 12.

As shown in the drawing, a 3D camera 121b according to another embodiment of the present invention may have a main PCB 230 associated therewith and having a greater thickness than in other embodiments. The absence of the camera PCB 225 between the first and second cameras 221 and 223 allows the thickness of the main PCB 230 to be less limited. Thus, the multilayered or double-sided main PCB 230 may be used.

Figure 14:
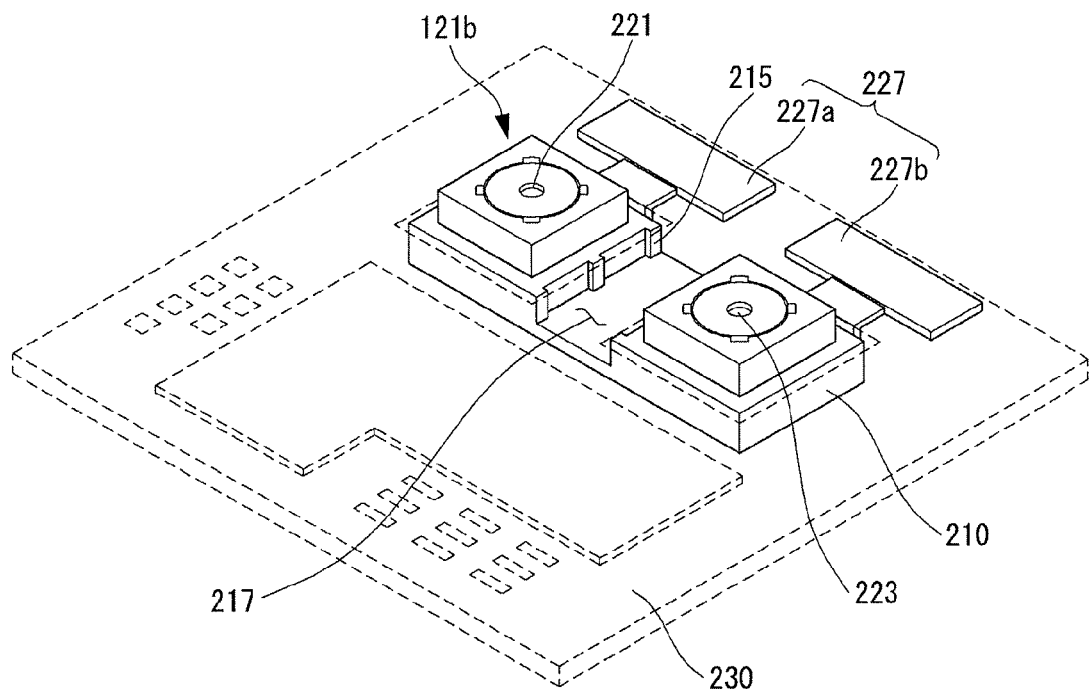
FIG. 14 is a mounting view of the camera of FIG. 12.

FIG. 14 is a mounting view of the camera illustrated in FIG. 12. As shown therein, the 3D camera 121b according to another embodiment of the present invention may be coupled to the main PCB 230.

The coupling between the 3D camera 121b and the main PCB 230 may be made through first and second connectors 227a and 227b extending from the 3D camera 121b. The first and second connectors 227a and 227b may be coupled to the lower surface of the main PCB 230. The first connector 227a may be a path through which an image captured by the first camera 221 is delivered, and the second connector 227b may be a path through which an image captured by the second camera 223 is delivered.

Figure 15:
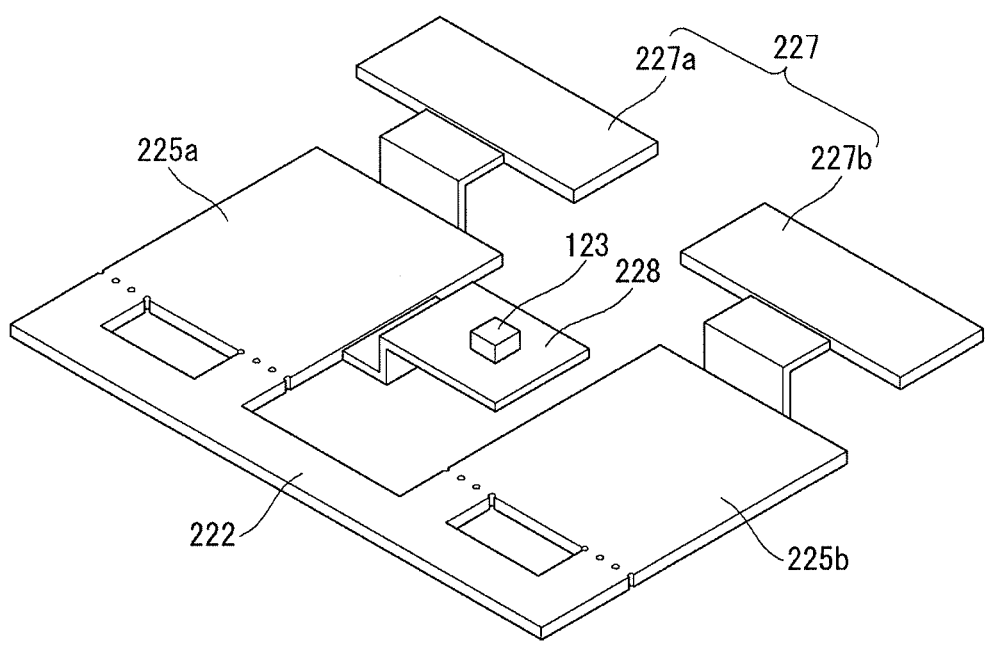
FIGS. 15 and 16 are views illustrating an assembly process of a camera according to another embodiment of the present invention.
Figure 16:
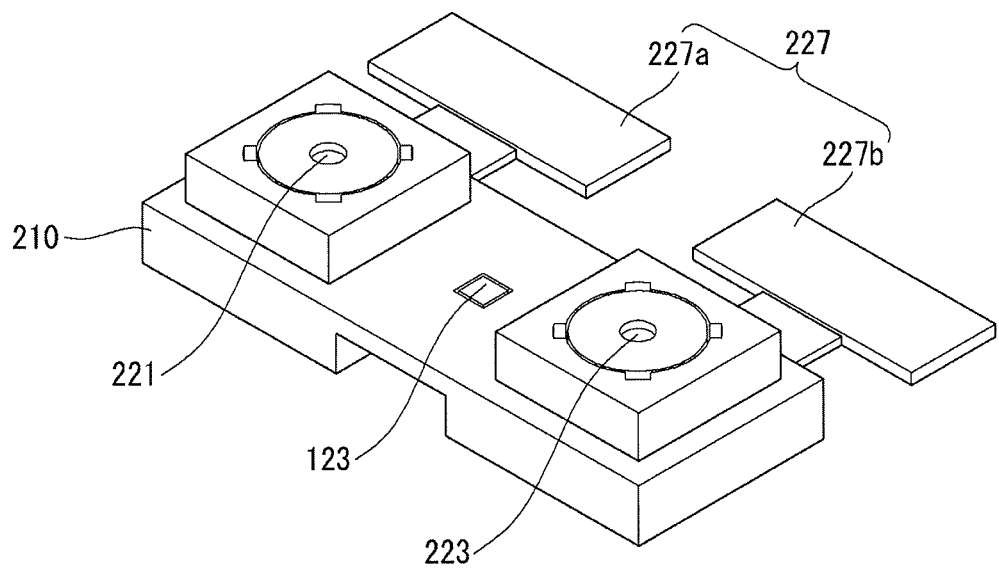

FIGS. 15 and 16 are views illustrating an assembly process of a camera according to another embodiment of the present invention.

As shown in the drawings, the 3D camera 121b may have a camera connector 228 provided with a camera flash 123 between the first and second cameras 221 and 223.

As shown in FIG. 15, the first camera coupling portion 225a and the second camera coupling portion 225b positioned at the camera PCB 225 may be connected by the connection portion 222. When the assembly of the first and second cameras 221 and 223 is completed, the connection portion 222 may be removed.

The camera connector 228 may extend from the first camera coupling portion 225a. The camera connector 228 may be located between the first and second camera coupling portions 225a and 225b.

As shown in FIG. 16, the bracket 210 may have a coupling hole associated with the camera flash 123.

Figure 17:
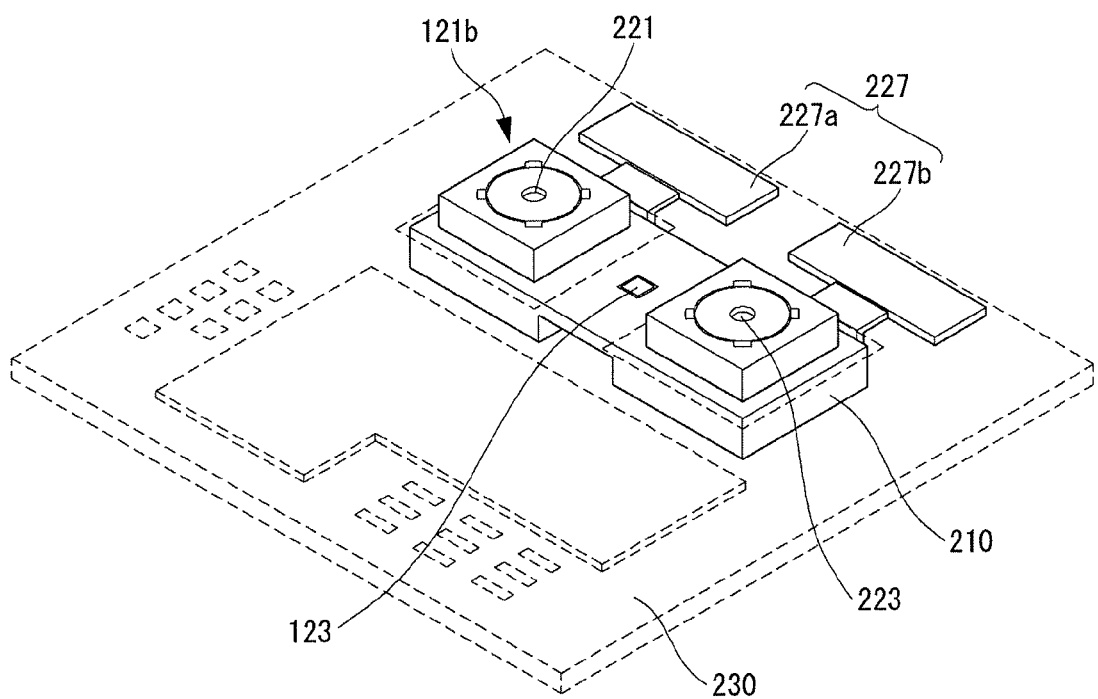
FIG. 17 is a mounting view of the camera of FIG. 16.

FIG. 17 is a mounting view of the camera of FIG. 16.

As shown in the drawing, the 3D camera according to another embodiment of the present invention may be coupled to the main PCB 230 through the first and second connectors 227a and 227b. The first and second connectors 227a and 227b may be coupled to the lower surface of the main PCB 230. The camera flash may be located between the first and second cameras 221 and 223.

Figure 18:
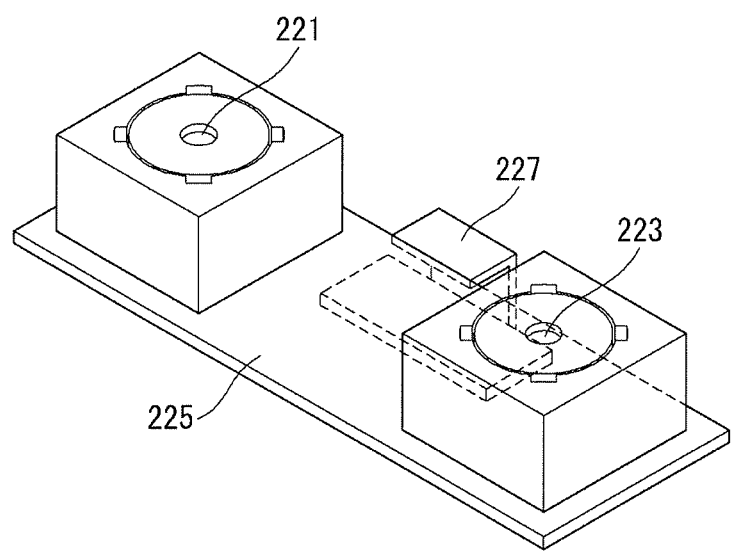
FIGS. 18 and 19 are views illustrating an assembly process of a camera according to another embodiment of the present invention.
Figure 19:
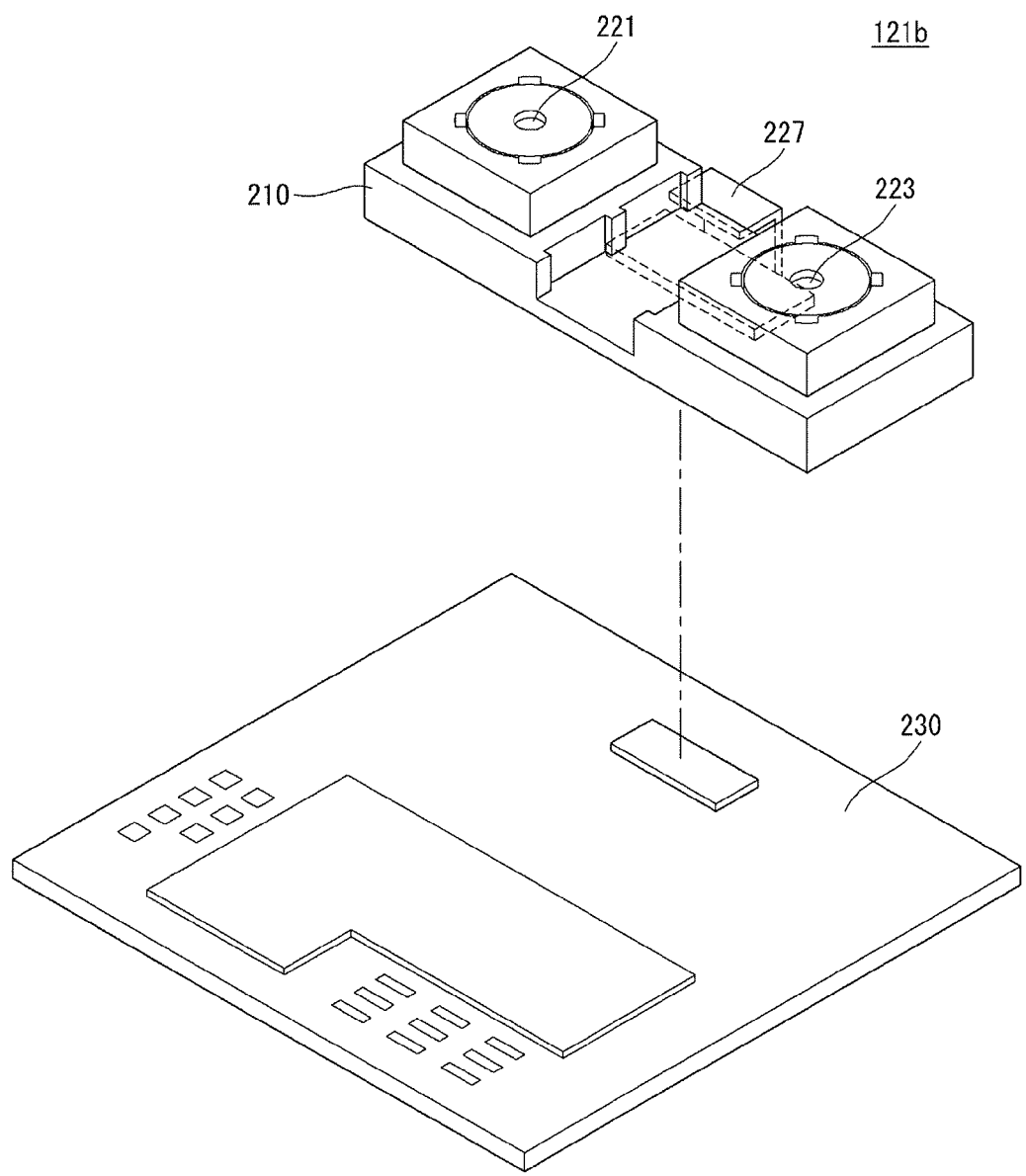

FIGS. 18 and 19 are views illustrating an assembly process of a camera according to another embodiment of the present invention.

As shown in FIG. 18, the 3D camera 121b according to another embodiment of the present invention may have the connector 227 positioned in the middle between the first and second cameras 221 and 223.

As shown in FIG. 19, the connector 227 facing downwardly between the first and second cameras 221 and 223 may be connected to the main PCB 230. The connector's facing downwards between the first and second cameras 221 and 223 facilitates connection with the main PCB 230 as well as allowing for effective spatial utilization.

Figure 20:
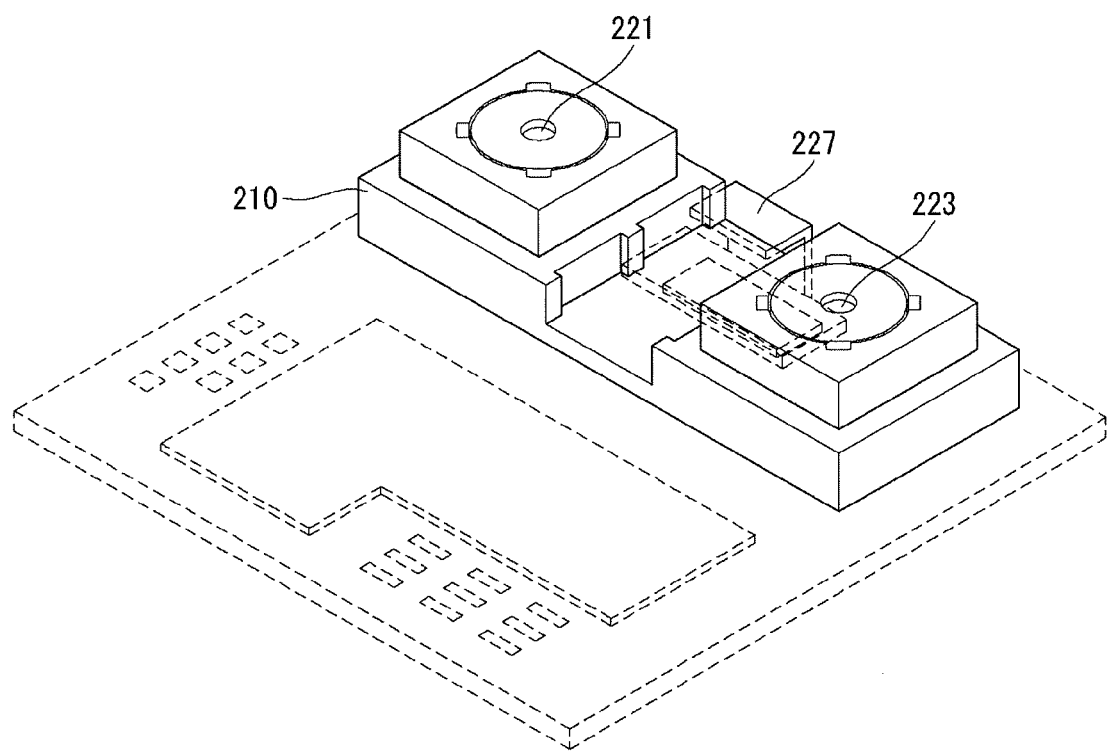
FIG. 20 is a mounting view of the camera.

FIG. 20 is a mounting view of the camera illustrated in FIG. 18.

As shown in the drawing, the 3D camera 121b according to another embodiment of the present invention may be coupled to the upper surface of the main PCB 230. The connector 227 extending downwardly of the 3D camera 121b may come into contact with the upper surface of the main PCB 230.

Figure 21:
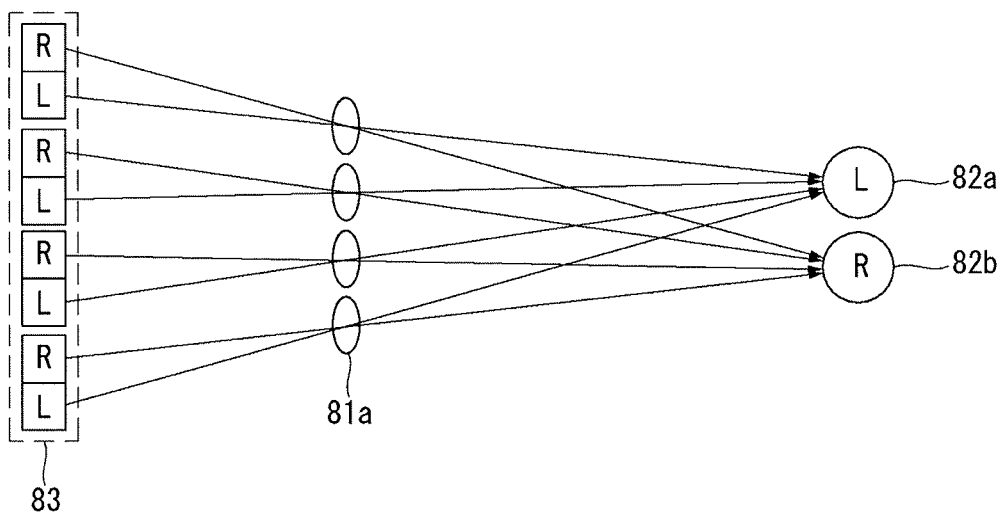
FIGS. 21 and 22 are views for explaining a method of displaying a stereoscopic image using binocular parallax associated with embodiments of the present invention.
Figure 22:
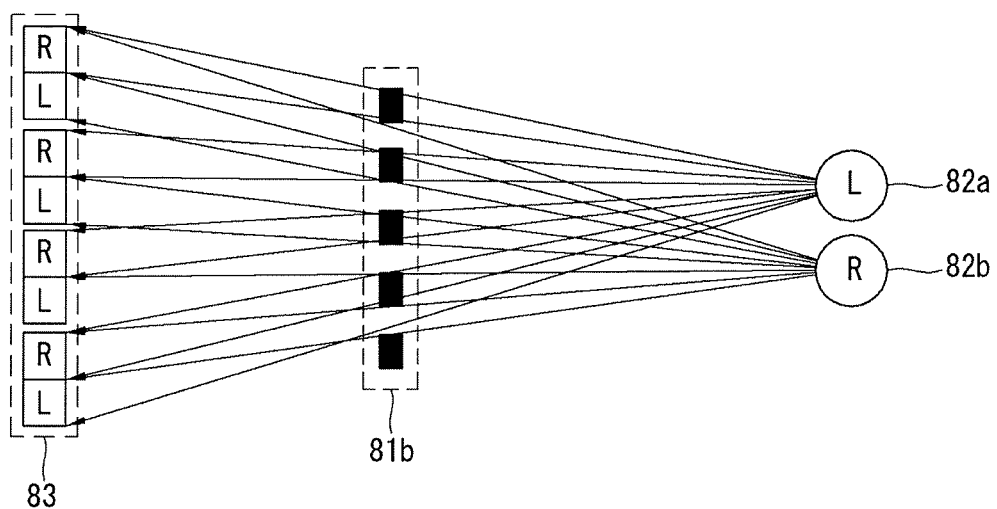

FIGS. 21 and 22 are views for explaining a method of displaying a stereoscopic image using binocular parallax related to embodiments of the present invention, and FIGS. 23 through 26 are views illustrating a method of displaying a stereoscopic image.

The binocular parallax (or a stereo disparity) means the difference of a person's right-eye vision and left-eye vision with respect to an object. The composition of an image viewed by the left eye and an image viewed by the right eye through the human brain allows the person to perceive stereoscopic depth. In the following description, a phenomenon in which a person perceives stereoscopic depth by the binocular parallax is called a 'stereoscopic vision' and an image causing the stereoscopic vision is called a 'stereoscopic image'. Also, in the event that a specific object included in an image causes a stereoscopic vision, the corresponding object is called a 'stereoscopic object'.

A method of displaying a stereoscopic image according to binocular parallax is classified into a glasses type requiring special glasses, or a non-glasses type requiring no glasses. Examples of the glasses type include a color-glasses type using color glasses having wavelength selectivity, a polarization glasses type using a light blocking effect according to a polarization difference, and a time-division glasses type in which left and right images are alternatively presented within an afterimage time of eyes. In addition to those, there is a method in which filters having different transmittances are respectively mounted for the left and right eyes so that the stereoscopic effect with respect to left and right movements is obtained according to the time difference of a visual system, caused by the difference in the transmittance.

As for the non-glasses type where the stereoscopic effect is created at the side of an image display not the side of an observer, there are a parallax barrier type, a lenticular lens type, or a microlens array type.

With reference to FIG. 21, a display module for displaying a stereoscopic image includes a lenticular lens array 81a. The lenticular lens array 81a is located between the left and right eyes 82a and 82b and a display panel 83 in which pixels L to be input to the left eye 82a and pixels R to be input to the right eye 82b are alternately arranged in a horizontal direction, and provides optical discrimination orientation with respect to the pixels L to be input to the left eye 82a and the pixels R to be input to the right eye 82b. Accordingly, an image having passed through the lenticular lens array 81a is observed separately by the left eye 82a and the right eye 82b, and the human brain carries out the composition of respective images viewed by the left eye 82a and the right eye 82b, so that the observer views a stereoscopic image.

With reference to FIG. 22, to display a stereoscopic image, the display module includes a parallax barrier 81b in the form of a vertical lattice. The parallax barrier 81b is located between the right and left eyes 82a and 82b and the display panel 83 in which pixels L to be input to the left eye 82a and pixels R to be input to the right eye 82b are alternately arranged in a horizontal direction, and allows an image to be observed separately by the left eye 82a and the right eye 82b through its apertures in the form of a vertical lattice. Subsequently, the human brain conducts the composition of images viewed by the left eye 82a and the right eye 82b, allowing the observer to view a stereoscopic image. Such a parallax barrier 81b is turned on and divides incident visions only when a stereoscopic image is to be displayed. When a two dimensional image is to be displayed, the parallax barrier 81b is turned off and transmits incident visions as they are without dividing them.

Meanwhile, the above methods of displaying a stereoscopic image are intended to explain embodiments of the present invention without limiting the present invention. In the present invention, various methods other than the above methods may be used to display a stereoscopic image using binocular parallax.

Figure 23:
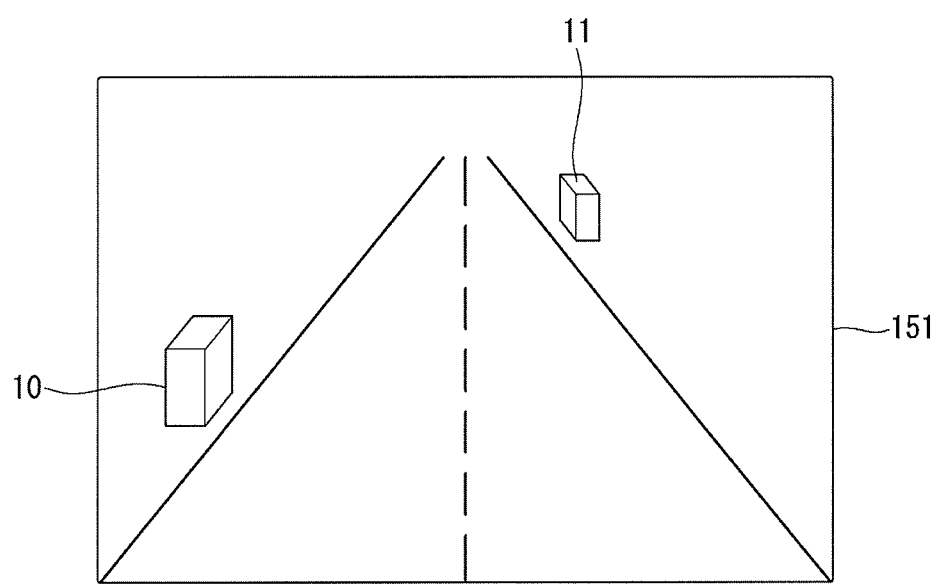
FIGS. 23 through 26 are views illustrating a method of displaying a stereoscopic image.

FIG. 23 illustrates an example in which a stereoscopic image including a plurality of image objects 10 and 11 is displayed.

For example, a stereoscopic image illustrated in FIG. 23 may be an image acquired through the camera 121. The stereoscopic image includes a first image object 10 and a second image object 11. Here, only two image objects 10 and 11 are depicted for convenience of a description, but in actuality, more image objects may be included in the stereoscopic image.

The controller may display an image, acquired in real time through the camera 121, on the display module 151 in the form of a camera preview.

The controller 180 may acquire one or more binocular parallaxes (or stereo disparities) respectively corresponding to the one or more image objects.

When the camera 121 is a 3D camera capable of acquiring a left-eye image and a right-eye image, the controller 180 may acquire the respective binocular parallaxes of the first image object and the second image object 11 through the left-eye and right-eye images obtained through the camera 121.

Figure 24:
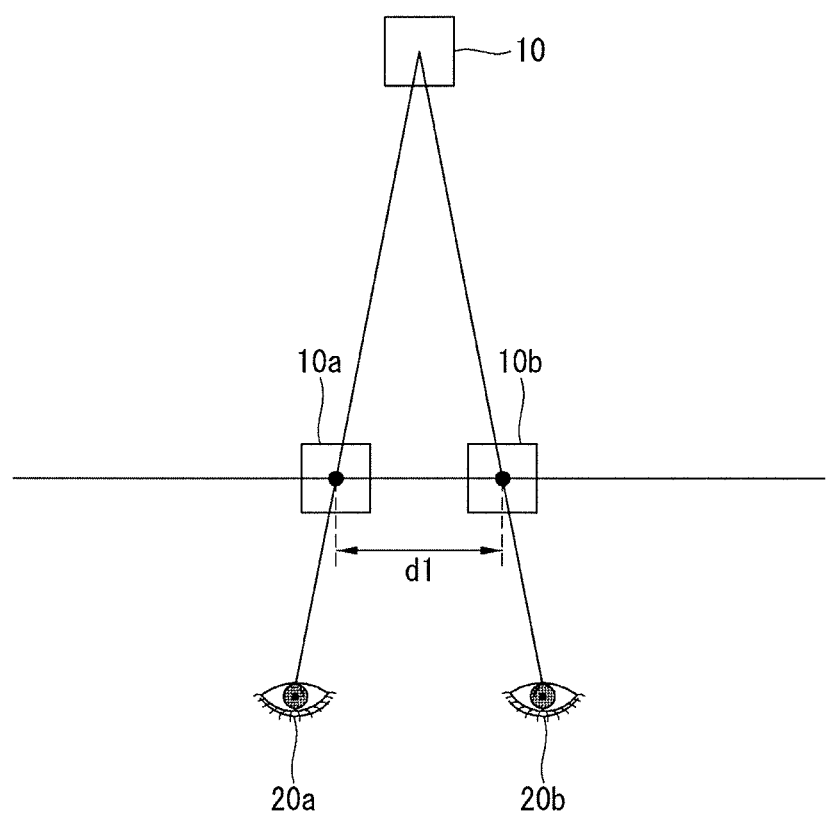

FIG. 24 is a view for explaining a binocular parallax of an image object included in a stereoscopic image.

For example, with reference to FIG. 24, the first image object 10 may be composed of a left-eye image 10a viewed by a user's left eye 20a, and a right-eye image 10b viewed by the right eye 20b.

The controller may acquire a binocular parallax d1 corresponding to the first image object on the basis of the left-eye image 10a and the right-eye image 10b.

Meanwhile, when the camera 121 is a 2D camera, the controller may convert a 2D image obtained by the camera 121 into a stereoscopic image by using a predetermined algorithm for converting a 2D image into a 3D image, and display the converted stereoscopic image on the display module.

Furthermore, the controller may individually acquire a binocular parallax of the first image object 10 and a binocular parallax of the second image object 11 on the basis of the left-eye image and the right-eye image created by using the aforementioned image conversion algorithm.

Figure 25:
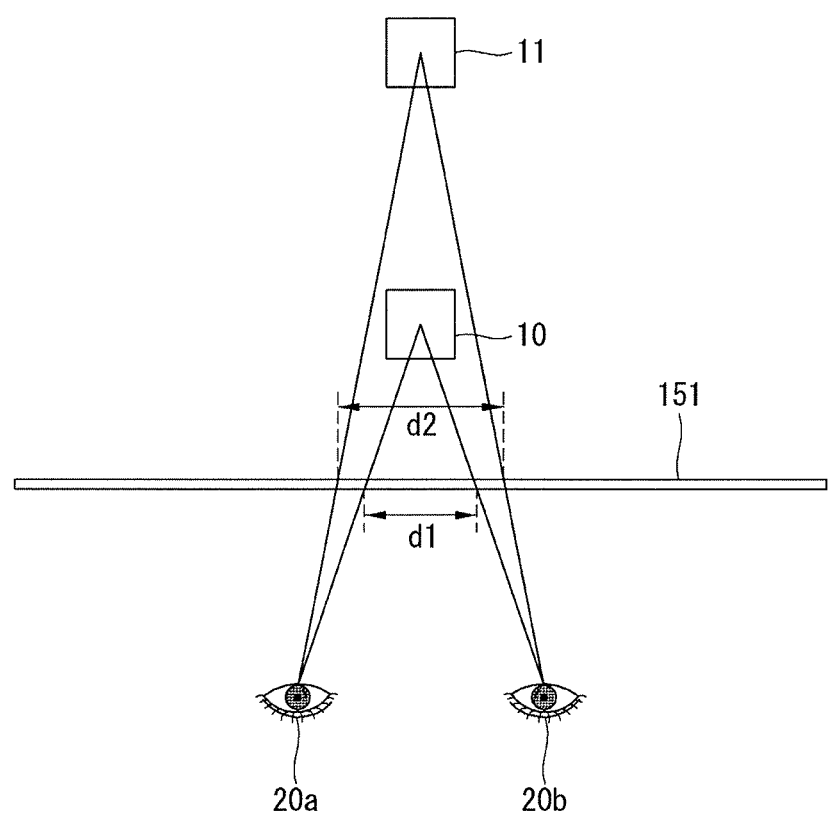

FIG. 25 is a view for comparing binocular parallaxes of the image objects 10 and 11 depicted in FIG. 23.

With reference to FIG. 25, the binocular parallax d1 of the first image object 10 and the binocular parallax d2 of the second image object 11 are different from each other. Also, as shown in FIG. 25, because d2 is greater than d1, the second image object 11 is perceived to be farther than the first image object 10 from a user.

The controller 180 may obtain one or more graphic objects respectively corresponding to the one or more image objects. Also, the controller 180 may display the obtained one or more graphic objects so as to have a corresponding binocular parallax.

Figure 26:
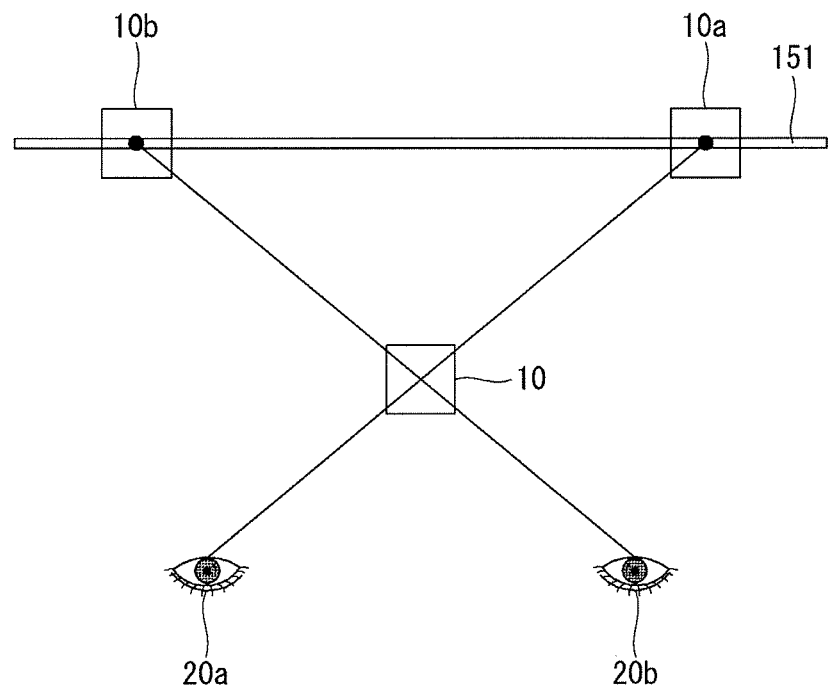

FIG. 26 illustrates a first image object that can be viewed from the display module 151 as though it protrudes toward a user. As shown therein, the locations of the light-eye image 10a and the right-eye image 10b on the display module 151 may be opposite to those shown in FIG. 24. When the left-eye image 10a and the right-eye image 10b are disposed oppositely in terms of location, the left eye 20a and the right 20b may view images in opposite directions. Accordingly, the user may perceive that the first image object 10 is disposed in front of the display module 151 where the sights thereof cross each other. That is, the user may perceive a positive (+) depth with respect to the display module 151. This is different from FIG. 24 where the user perceives negative (−) depth as though the first image object 10 is displayed in back of the display module 151.

The controller 180 allows a user to perceive various depths by displaying a stereoscopic image with positive or negative depth as appropriate.

The above-described method of controlling the mobile terminal may be written as computer programs and may be implemented in digital microprocessors that execute the programs using a computer readable recording medium. The method of controlling the mobile terminal may be executed through software. The software may include code segments that perform tasks. Programs or code segments may also be stored in a processor readable medium or may be transmitted according to a computer data signal combined with a carrier through a transmission medium or communication network.

The computer readable recording medium may be any data storage device that can store data that can be thereafter read by a computer system. Examples of the computer readable recording medium may include read-only memory (ROM), random-access memory (RAM), CD-ROMs, DVD±ROM, DVD-RAM, magnetic tapes, floppy disks, and optical data storage devices. The computer readable recording medium may also be distributed over network coupled computer systems so that the computer readable code is stored and executed in a distribution fashion.

A mobile terminal may include a first touch screen configured to display a first object, a second touch screen configured to display a second object, and a controller configured to receive a first touch input applied to the first object and to link the first object to a function corresponding to the second object when receiving a second touch input applied to the second object while the first touch input is maintained.

A method may be provided of controlling a mobile terminal that includes displaying a first object on the first touch screen, displaying a second object on the second touch screen, receiving a first touch input applied to the first object, and linking the first object to a function corresponding to the second object when a second touch input applied to the second object is received while the first touch input is maintained.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A mobile terminal comprising:
   a front body including a touch screen located on a front side of the mobile terminal;
   a rear body coupled to the front body and located at a rear side of the mobile terminal, the rear body including first and second holes;

first and second cameras for capturing an image, the first and second cameras corresponding to the first and second holes;

a bracket coupled to the first and second cameras, the bracket including third and fourth holes corresponding the first and second cameras;

a main printed circuit board (PCB) including electronic components and electronic circuits for operation of the mobile terminal;

a camera PCB coupled to the first and second cameras; and a connector extended from the camera PCB, the connector connected to the main PCB electrically, wherein the bracket surrounds each of the first and second cameras, and wherein at least a portion of the bracket is surrounded by the main PCB.

2. The mobile terminal of claim 1, wherein at least the portion of the bracket includes a sidewall.

3. The mobile terminal of claim 2, wherein the main PCB is located beside the sidewall.

4. The mobile terminal of claim 1, wherein the bracket includes a bridge between the first hole and the second hole.

5. The mobile terminal of claim 4, wherein the bracket is formed integrally.

6. The mobile terminal of claim 4, wherein the bracket is made of a metal.

7. The mobile terminal of claim 1, wherein the connector is connected on a surface of the main PCB.

8. The mobile terminal of claim 7, wherein the surface of the main PCB faces the rear body.

9. The mobile terminal of claim 1, wherein the connector is provided as a plurality of connectors.

10. The mobile terminal of claim 9, wherein the connectors are connected on a surface of the main PCB, and the surface of the main PCB faces the rear body.

* * * * *